United States Patent [19]

Klee

[11] 4,450,518

[45] May 22, 1984

[54] CONTROL SYSTEM FOR ADJUSTING A PHYSICAL QUANTITY

[75] Inventor: Heinz Klee, Freiburg-Opfingen, Fed. Rep. of Germany

[73] Assignee: ITT Industries, Inc., New York, N.Y.

[21] Appl. No.: 274,039

[22] Filed: Jun. 15, 1981

[30] Foreign Application Priority Data

Jul. 4, 1980 [DE] Fed. Rep. of Germany ....... 3025358

[51] Int. Cl.³ .................... G05B 15/02; H03J 5/02; H03B 3/04
[52] U.S. Cl. .................... 364/183; 331/1 A; 334/15; 340/347 DA; 364/182; 455/182; 455/184
[58] Field of Search ............... 364/137, 148, 176, 182, 364/183; 219/441, 442, 489, 494; 318/601; 334/15; 455/182, 184, 186, 187; 331/1 A

[56] References Cited

U.S. PATENT DOCUMENTS

| | | | |
|---|---|---|---|
| 3,922,609 | 11/1975 | Grohman | 455/184 X |
| 3,932,863 | 1/1976 | Pastoriza | 340/347 DA |
| 3,978,473 | 8/1976 | Pastoriza | 340/347 DA |
| 3,995,266 | 11/1976 | Müller et al. | 340/347 DA |
| 4,077,009 | 2/1978 | Klank et al. | 455/184 X |
| 4,114,100 | 9/1978 | Klank | 455/184 |
| 4,147,966 | 4/1979 | Kain et al. | 318/601 |
| 4,197,503 | 4/1980 | Dini | 334/15 X |
| 4,216,415 | 8/1980 | Shimonou et al. | 318/601 X |
| 4,369,352 | 1/1983 | Bowles | 219/494 X |
| 4,380,742 | 4/1983 | Hart | 331/1 A |

FOREIGN PATENT DOCUMENTS

| | | | |
|---|---|---|---|
| 1287167 | 1/1969 | Fed. Rep. of Germany | 331/1 A |
| 2512738 | 9/1976 | Fed. Rep. of Germany | 331/1 A |
| 2814577 | 10/1979 | Fed. Rep. of Germany | 334/15 |
| 1268322 | 3/1972 | United Kingdom | 331/1 A |

OTHER PUBLICATIONS

Winkelstein: Minicomputer-Controlled Programmed Oscillator, TPL Quarterly Technical Review, vol. No. 3, Oct. 1971.

*Primary Examiner*—Felix D. Gruber
*Attorney, Agent, or Firm*—James B. Raden; Donald J. Lenkszus

[57] ABSTRACT

A control system for adjusting a physical value, e.g. the resonance frequency of an oscillator comprising a bank of keys to provide the physical value as a digital word A, a microprocessor to convert the word A to a digital word B, a D/A converter to convert the word B to a voltage to control an electronic adjusting component of the oscillator, e.g. a varactor diode, and a measuring device to measure the output of the oscillator and provide a digital word C for coupling to the microprocessor. The microprocessor compares the word B with the word C and provides a correcting digital word ΔB which is added to the word B for application to the oscillator through the D/A converter. This process is continued until the word B is equal to the word C.

8 Claims, 3 Drawing Figures

CONTROL SYSTEM FOR ADJUSTING A PHYSICAL QUANTITY

BACKGROUND OF THE INVENTION

The present invention relates to a control system for adjusting a physical quantity of any device to a set point provided by a set-point generator, such as the temperature of an electric heating device, the speed of an electric motor or the resonant frequency of a resonant circuit, using an electronically variable adjusting element to which an analog adjusting signal is applied.

Such an adjusting element is, for example, an electronically variable resistor with which the electric current through a furnace or that of an electric motor is controlled. In the case of a resonant circuit, an element suitable for adjusting the resonant frequency is a varactor diode, whose capacitance varies with the applied voltage, as is well known.

SUMMARY OF THE INVENTION

An object of the present invention is to provide a control system for adjusting a physical quantity to a digital set point by means of an adjusting element to which an analog adjusting signal is applied.

The invention is predicated on the idea of entering the set point of the physical variable in digital form through a push-button assembly, to place a digital-to-analog (D/A) converter between the adjusting element and the set-point generator, to convert the actual value of the physical quantity into a digital value (word) which is compared with the set point, and to impress, by means of an electronic computer (microcompressor), a correcting value on the signal entered into the D/A converter, so that the set point of the physical variable of the device is set by means of the adjusting element.

Another object of the present invention is to provide a fast control system which, except for the set-point generator and the adjusting element, can be implemented using integrated circuit techniques.

A feature of the present invention is the provision of a control system for adjusting a physical quantity to a digital set point by means of an adjusting element of a device having the physical quantity to which an analog adjusting signal is applied comprising: first means to provide the set point in the form of a digital word A; second means having an output, a first input coupled to the first means and a second input coupled to the device having the physical quantity to receive a digital word C indicative of the actual value of the physical quantity, the second means converting the word A to a digital word B, comparing the word A with the word C to provide a digital correcting value ΔB and to provide at the output the word B+the ΔB; and third means coupled to the output of the second means and the adjusting element to provide the analog adjusting signal proportional to the word B+the ΔB for the adjusting element.

In such a control system the push-button unit and the adjusting element need not need moving parts, as is the case in commercially available television sets. The control system according to the present invention is preferably used in high-quality tuners for television and broadcast receivers.

The present invention will now be explained as applied to such a tuner.

High-quality tuners currently use phase-locked loop (PLL) systems, in which the voltage applied to a varactor diode must be smoothed by means of capacitors of relatively high value. Such capacitors cannot be incorporated into integrated circuit without sacrificing a considerable portion of the crystal surface. Another disadvantage of such capacitors lies in the fact that the adjusting process takes several milliseconds.

These disadvantages are avoided in the control system according to the present invention.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENT

The control system according to the present invention, except for the D/A converter, can be built with commercially available integrated circuits. The D/A converter, which is considered an essential part of the present invention, will be described first.

Because of manufacturing tolerances in monolithic integrated D/A converters, linearity, monotonicity, and resolution capability are limited. In the converter necessary for the control system according to the present invention, at least two converter sections are provided, the first of which has a finely stepped range, while the second has a coarsely stepped range. In the converter of the embodiment for computer-controlled tuner adjustment, two converter sections are provided for two different operating ranges.

The finely stepped range must meet the monotonicity requirements commonly placed on integrated D/A converters, which can be approximately met by holding close manufacturing tolerances and using topologically similar structures. For example, topologically similar transistors, such as field-effect transistors, should be used to implement the resistors and current sources.

Figure 1:
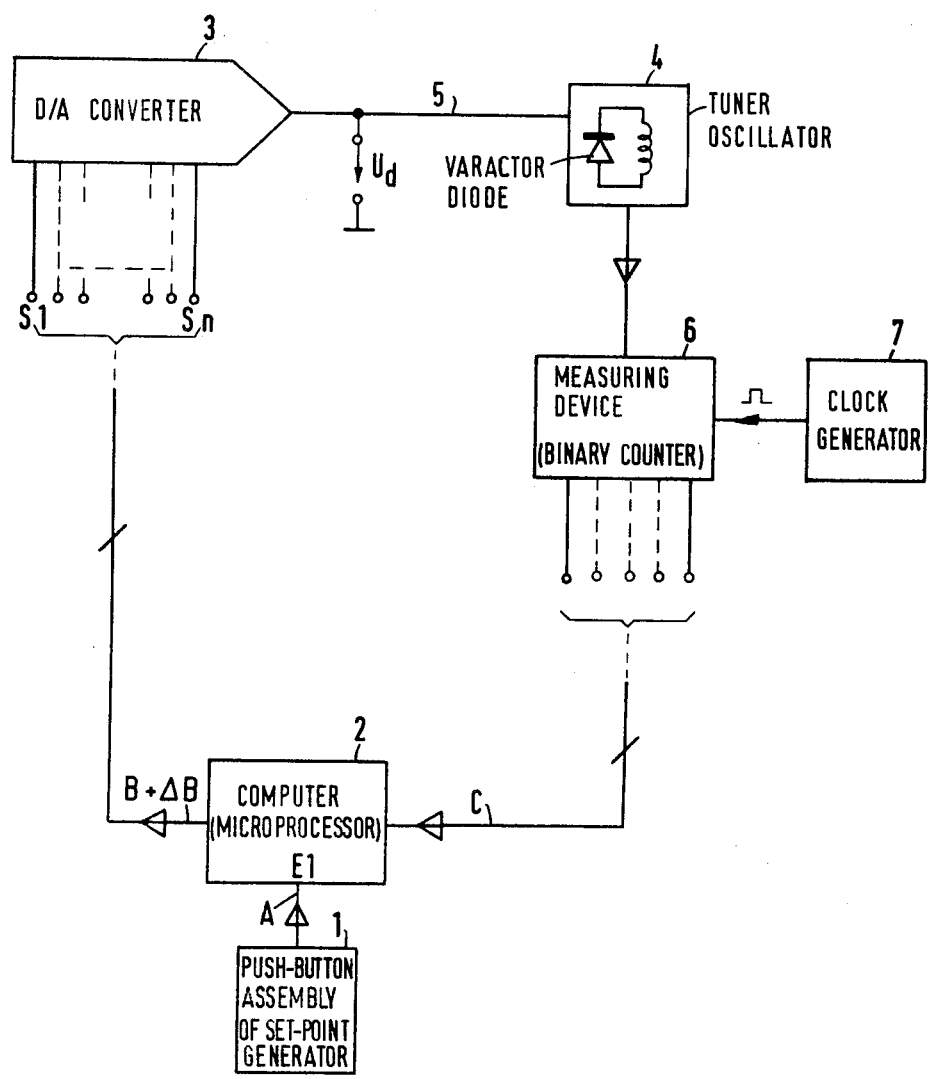
FIG. 1 is a block diagram of a control system in accordance with the principles of the present invention for tuning tuners for television and broadcast receivers.
Figure 2:
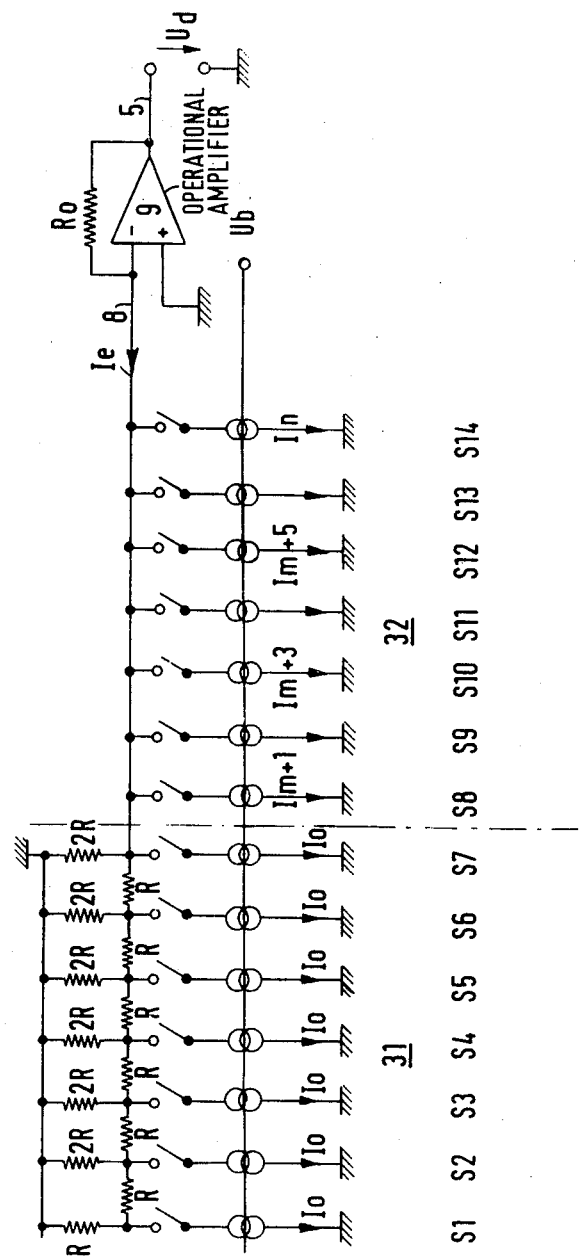
FIG. 2 is a schematic circuit diagram of the D/A converter contained in the control system of FIG. 1.

FIG. 2 shows the schematic diagram of a 10-bit converter comprising a first converter section 31 with a finely stepped bit range S1 to S7 and a second converter section 32 with a coarsely stepped bit range S8 to S14. Each bit line contains a current source and an electronic switch connected in series between ground and the summing line 8, which contains series-connected equal-value resistors R in the converter section 31. The control lines of the electronic switches are connected to the computer 2 of FIG. 1. The control electrodes of the current sources are connected jointly to the bias Ub. If the current sources are field-effect transistors, the gate electrodes are thus connected to this bias.

The junction points of the series resistors having a resistance R are connected to ground through shunt resistors of resistance 2R. The 2R-R-network thus obtained is terminated with a resistor having a value of 2R at the output end, and with a resistor having a value of R at the input end, as can be seen in FIG. 2. The output of the converter is coupled to an operational amplifier 9, between the output and input of which is connected a resistor Ro for adjusting the gain of the system. The output voltage Ud of the converter is applied to the varactor diode.

The first section 31 of the D/A converter of FIG. 2 is so designed that the sum of the currents I1 to I7 fed into the summing line 8 upon actuation of the respective bit switches S1 to S7 is greater than each of the currents Im+1 to In of the second converter section 32. Thus, each current range Im+1 to In is overlapped by the current range of the first converter section 31, and this gives a converter characteristic as shown schematically in FIG. 3 but with only eight steps for the first converter section with a finely stepped range.

By contrast, the converter section 31 of FIG. 2 can feed a 123-step current into the summing line 8 in accordance with the equation $$Ie = Io\left(S7 + \frac{1}{2}S6 + \frac{1}{4}S5 + \frac{1}{8}S4 + \frac{1}{16}S3 + \frac{1}{32}S2 + \frac{1}{64}S1\right) \quad S1\ldots S7 = 0.1$$

Figure 3:
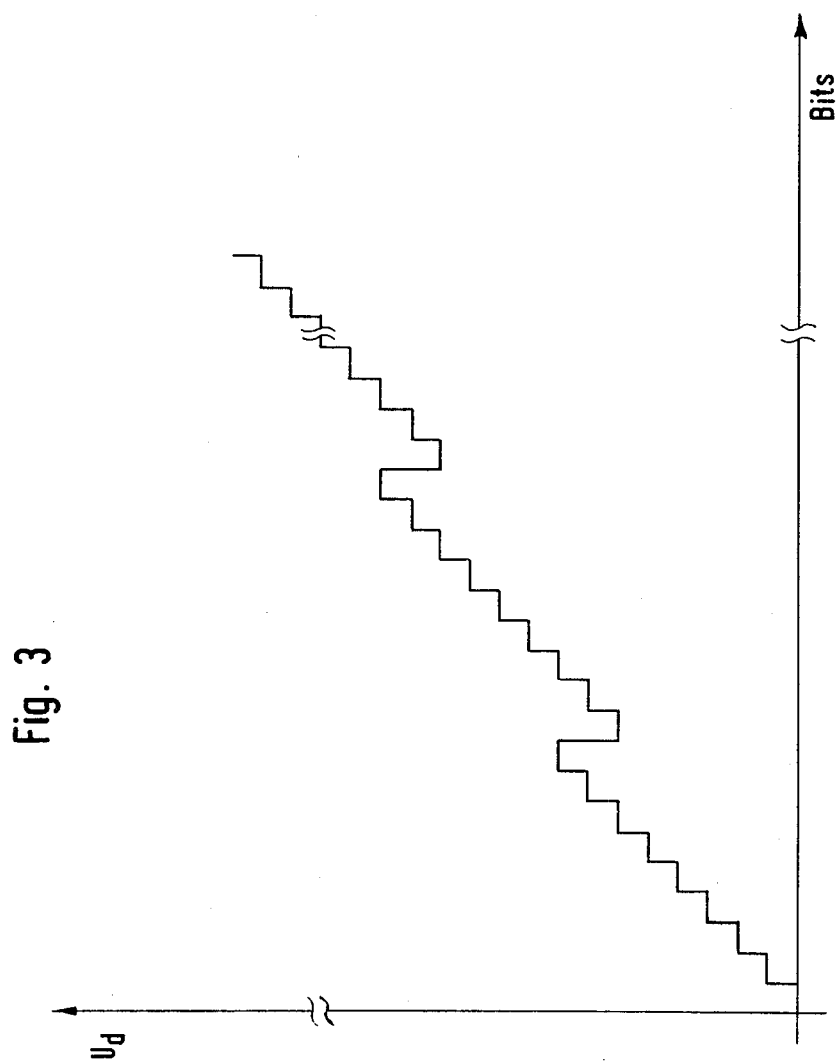
FIG. 3 is a graph of a converter characteristic to explain the operation of the control system of FIG. 1.

The second converter section 32, unlike the first converter section 31, has no R–2R network but current sources Im+1 to In in series with electronic switches. These currents can be chosen to be equal in magnitude, so that the converter characteristic of FIG. 3 is obtained by injecting a current at the end of each course step. The computer 2 can also be programmed so that the same result is obtained with a converter 3 whose section 32 has currents stepped in the geometric progression 1, 2, 4, 8, 16 . . . . This can be achieved by connecting a suitable number of switches in parallel.

The automatic adjusting process in the control system according to the present invention is as follows:

1. The push button assembly 1 is used to enter a desired frequency or channel into the computer (microprocessor) 2. If the push button assembly is utilized to select a frequency then the computer 2 receives a digital word A representing the frequency. If the push button assembly provides an output representative of the channel, the computer 2 will convert the channel into digital word A which represents the frequency corresponding to the selected channel. The computer 2 converts word A into a second digital word B which represents the voltage level Ud to which the D/A converter 3 is to be set such that the voltage controlled oscillator 4 will operate at the frequency of the signal to be tuned in.

2. The converter 3 converts the word B into the voltage Ud, which is applied to the varactor diode of the tuner oscillator 4 and varies the oscillator frequency.

3. The oscillator frequency is measured to the required accuracy by the measuring device 6 which consists of a binary counter driven by a clock generator 7. The output of the binary counter or measuring device 6 provides a digital word C which is an indicator of the actual frequency of oscillation of the tuner oscillator 4, and is made available to the computer 2, as can be seen in FIG. 1.

4. The computer 2 compares the word A with the word C, forming a frequency difference which the computer 2 utilizes to provide a corresponding correcting value ΔB, which is added to the present word B to reach the set point.

5. The adjusting process is repeated until word B causes D/A converter 3 to generate a voltage level Ud such that word A is equal to word C.

In an experimental control system for adjusting frequencies of an oscillator 4 whose values are entered through the pushbutton assembly of a set-point generator 1, the computer 2 was a commercially available 8080 microprocessor, and the measuring device 6 was a commercial available 74197 binary counter. It should be noted that computers of considerable simpler design than that of the 8080 can be employed in a control system according to the present invention. The clock generator 7 provides the binary counter 6 with a gated period T within which a measurement of the oscillator frequency can take place. The gated period must be $$T = \frac{2^N}{fo},$$

where N=number of bits, i.e., 14 in this embodiment, and fo=maximum frequency of the oscillator 4.

The control system according to the present invention has the advantage that the adjustment of an oscillator frequency, for example, no longer necessitates the use of costly integrated D/A converters of conventional design. Monotonicity errors are deliberately entered into the control system according to the present invention, which permit any analog voltage to be set to a high degree of accuracy. The monotonicity errors are detected and compensated by the computer 2. The control system according to the present invention can thus be called a "self-correcting control system" in which a microcomputer calculates and eliminates errors in the D/A converter characteristic. In a control system according to the present invention, different basic designs of D/A converters can be employed, but with the deliberate introduction of monotonicity errors, the circuit design of the D/A converters must be modified so that the weights in the coarsely stepped range are "underweighted," so that the sum of the currents I1 to Im in the finely stepped current range is greater than the current Im+1 in the coarsely stepped current range, and that the current Im+2=Im+1 or 2·Im+1. In the latter case, the coarsely stepped range would be stepped in itself according to the binary code.

The currents in the finely stepped converter section can also be realized by stepped current sources, for example. Likewise, certain resistors of a D/A converter of the R–2R type can be adapted for use in a control system according to the present invention on the above principle. The switches of the set-point generator 1 of a control system according to the present invention may also be actuated by a program carrier as is commonly done in the control of machine tools.

While I have described above the principles of my invention in connection with specific apparatus it is to be clearly understood that this description is made only by way of example and not as a limitation to the scope of my invention as set forth in the objects thereof and in the accompanying claims.

I claim:

1. A control system for adjusting a physical quantity to a digital set point by means of an adjusting element of a device having said physical quantity to which an analog adjusting signal is applied comprising:
   first means to provide said set point in the form of a digital word A;

second means having an output, a first input coupled to said first means and a second input coupled to said device having said physical quantity to receive a digital word C indicative of the actual value of said physical quantity, said second means converting said word A to a digital word B, comparing said word A with said word C to provide a digital correcting value ΔB and to provide a new word B at said output said new word B equalling the sum of sad word B and said ΔB;

a digital-to-analog (D/A) converter coupled to said output of said second means and said adjusting element to provide said analog adjusting signal proportional to said word B+said ΔB for said adjusting element; and said D/A converter including an output line coupled to said adjusting element a current-to-voltage converter coupled between said output line and summing line of at least two D/A converter sections, a first of said two sections having a finely stepped current range and a second of said two sections having a coarsely stepped current range, the sum of the currents of said finely stepped range being greater than the current of a first step of said coarsely stepped range, the current of the next adjacent step of said coarsely stepped range being either equal to or twice the current of said first step of said coarsely stepped range.

2. A control system according to claim 1, wherein said first means includes a push-button assembly to provide said word A.

3. A control system according to claims 1 or 2, wherein said second means includes a measuring device coupled to said device having said physical quantity to provide said word C, and a microprocessor coupled to said first means and said measuring device to provide at said output said word B+said ΔB.

4. A control system according to claim 3, wherein said measuring device includes a clock generator, and a binary counter coupled to said device having said physical quantity and said clock generator to provide said word C.

5. An oscillator arrangement for a receiver tuner comprising:

a voltage controlled oscillator;

a digital-to-analog converter having input terminals and having an output coupled to said voltage controlled oscillator for supplying a frequency determining voltage thereto in response to a first digital word said input terminals;

a measuring circuit for measuring the frequency of said voltage controlled oscillator and providing a second digital word representing said measured frequency;

means for generating an indication of a desired frequency;

processing means for converting said indication to a third digital word, for generating said first word in accordance with said third word, for comparing said third word to said second word and for providing a correction value in accordance with said comparison, said first word being modified in accordance with said correction value;

said D/A converter including:

an output line coupled to said output;

a current-to-voltage converter coupled between said output line and a summing line of at least two D/A converter sections, a first of said two sections having a finely stepped current range and a second of said two sections having a coarsely stepped current range, the sum of the currents of said finely stepped range being greater than the current of a first step of said coarsely stepped range, the current of said first step of said coarsely stepped range being equal to the current of the next adjacent step of said coarsely stepped range.

6. An oscillator arrangement in accordance with claim 5, wherein said processing means comprises a microprocessor.

7. An oscillator arrangement in accordance with claim 6, wherein said measuring device includes a clock generator, and a binary counter coupled to said oscillator and said clock generator to provide said second word.

8. An oscillator arrangement in accordance with claim 5, wherein said measuring device includes a clock generator, and a binary counter coupled to said oscillator and said clock generator to provide said second word.

* * * * *